US011121688B2

(12) United States Patent
Singh

(10) Patent No.: US 11,121,688 B2
(45) Date of Patent: Sep. 14, 2021

(54) AMPLIFIER WITH DUAL CURRENT MIRRORS

(71) Applicant: TEXAS INSTRUMENTS INCORPORATED, Dallas, TX (US)

(72) Inventor: Ravpreet Singh, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 16/407,960

(22) Filed: May 9, 2019

(65) Prior Publication Data

US 2020/0204126 A1 Jun. 25, 2020

(30) Foreign Application Priority Data

Dec. 24, 2018 (IN) ............................. 201841048832

(51) Int. Cl.

*H03F 3/45* (2006.01)
*H03F 1/22* (2006.01)
*H03F 3/21* (2006.01)

(52) U.S. Cl.

CPC ........... *H03F 3/45089* (2013.01); *H03F 1/22* (2013.01); *H03F 3/21* (2013.01); *H03F 2203/45054* (2013.01); *H03F 2203/45182* (2013.01); *H03F 2203/45344* (2013.01)

(58) Field of Classification Search

CPC .......... H03F 3/45089; H03F 1/22; H03F 3/21; H03F 2203/45344; H03F 2203/45054; H03F 2203/45182; H03F 3/3022; H03F 3/45183; H03F 3/45192; H03F 3/45071; H03F 3/45085

USPC .................................................. 330/255, 257

See application file for complete search history.

(56) References Cited

U.S. PATENT DOCUMENTS 5,585,763 A * 12/1996 Navabi ................. H03F 3/3001 330/255
5,942,941 A * 8/1999 Corsi .................... H03F 3/3076 330/255
6,362,686 B1 * 3/2002 Escobar-Bowser .......................... H03F 3/45094 330/252
6,531,921 B2 * 3/2003 Horie .................. H03F 3/45192 330/255
7,471,150 B2 * 12/2008 Alenin ...................... H03F 1/26 330/255
7,557,658 B2 * 7/2009 Perez ........................ H03F 1/02 330/255
7,719,358 B2 * 5/2010 Hsu ..................... H03F 3/45192 330/253

* cited by examiner

*Primary Examiner* — Khanh V Nguyen
(74) *Attorney, Agent, or Firm* — John R. Pessetto; Charles A. Brill; Frank D. Cimino

(57) ABSTRACT

An amplifier includes a first input transistor, a second input transistor, a first current mirror circuit, and a second current mirror circuit. The first input transistor is coupled to a first input terminal. The second input transistor is coupled to a second input terminal. The first current mirror circuit is coupled to the first input transistor and the second input transistor. The second current mirror circuit is coupled to the first input transistor, the second input transistor, and the first current mirror circuit.

11 Claims, 3 Drawing Sheets

AMPLIFIER WITH DUAL CURRENT MIRRORS

CROSS-REFERENCE TO RELATED APPLICATIONS

The present application claims priority to India Provisional Patent Application No. 201841048832, filed Dec. 24, 2018, entitled "Dual Differential to Single-Ended Current Mirrors in Amplifiers," which is hereby incorporated herein by reference in its entirety.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An operational amplifier may include multiple stages, where each stage is designed to perform different functions. For example, an earlier stage (in the signal path) may be designed to provide voltage/current amplification, while a later stage may be designed to provide power amplification while maintaining a high efficiency.

SUMMARY

Operational amplifiers with an input stage that includes dual current mirrors are disclosed herein. In one example, an amplifier includes a first input transistor, a second input transistor, a first current mirror circuit, and a second current mirror circuit. The first input transistor is coupled to a first input terminal. The second input transistor is coupled to a second input terminal. The first current mirror circuit is coupled to the first input transistor and the second input transistor. The second current mirror circuit is coupled to the first input transistor, the second input transistor, and the first current mirror circuit.

In another example, an amplifier input stage includes a first input transistor, a second input transistor, a first cascode transistor, a second cascode transistor, a first current mirror circuit, and a second current mirror circuit. The first input transistor includes a first terminal coupled to a first signal input terminal of the amplifier input stage. The second input transistor includes a first terminal that is coupled to a second signal input terminal of the amplifier input stage. The second input transistor includes a second terminal that is coupled to a second terminal of the first input transistor. The first cascode transistor includes a first terminal that is coupled to a third terminal of the first input transistor. The second cascode transistor includes a first terminal that is coupled to a third terminal of the second input transistor. The first current mirror circuit is coupled to a second terminal of the first cascode transistor and a second terminal of the second cascode transistor. The second current mirror circuit is coupled to the second terminal of the first cascode transistor and the second terminal of the second cascode transistor.

In a further example, an amplifier includes a first input transistor, a second input transistor, a first cascode transistor, a second cascode transistor, a first current mirror circuit, and a second current mirror circuit. The first input transistor and the second input transistor are configured to receive a differential input signal. The first cascode transistor is coupled to the first input transistor. The second cascode transistor is coupled to the second input transistor. The first current mirror circuit is configured to source current to the first cascode transistor and the second cascode transistor. The second current mirror circuit is coupled to the first cascode transistor and the second cascode transistor in parallel with the first current mirror circuit, and is configured to source current to the first cascode transistor and the second cascode transistor.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some operational amplifiers include differential to single-ended current mirrors in the input stage signal path. The current mirrors use strong emitter degeneration to limit flicker and thermal noise. During large signal operation and slewing conditions, the degeneration increases significantly and limits the amplifier's headroom. Some amplifiers include passive clamping across the degeneration resistors to limit voltage drop. However, with passive clamps the clamping voltage generally cannot be controlled.

Some operational amplifiers also include a shaped open loop gain with a pole-zero pair inserted below the unity gain bandwidth to increase gain bandwidth product without impacting stability. The pole-zero pair is frequently inserted at the current mirror node by making the current mirror low bandwidth. Because the pole-zero is added only in the current mirror path, extra phase lag is applied to one-half cycle of large signal going through the current mirror. Because the other half cycle of the large signal doesn't see the phase lag, even order harmonics are increased for frequencies above about ten times lower than the mirror pole.

The operational amplifiers of the present disclosure increase headroom and reduce harmonic distortion by including dual current mirrors in the input stage. The second current mirror is active only when large currents are needed, and is off during quiescent operation. Accordingly, the second current mirror contributes no noise or offset to the amplifier. For large currents, the second current mirror provides low impedance and effectively pushes out the phase lag of the mirror pole. The second current mirror also acts as a clamp during slewing of the amplifier, and the clamping voltage is easily controlled.

Figure 1:
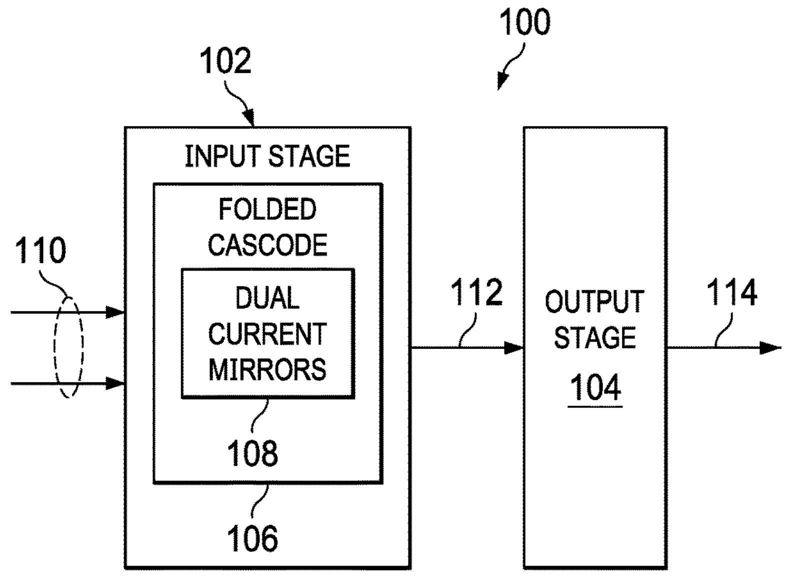
FIG. 1 shows a block diagram for an example amplifier that includes dual current mirrors in accordance with the present disclosure.

FIG. 1 shows a block diagram for an example amplifier 100 in accordance with the present disclosure. The amplifier 100 includes an input stage 102 and an output stage 104. The input stage 102 receives a differential input signal 110 and produces an output signal 112. The output stage 104 receives the output signal 112 generated by the input stage 102, and further amplifies the output signal 112 to produce amplifier output signal 114. The output stage 104 includes class-AB amplifier circuitry in some implementations.

The input stage 102 includes folded cascode circuitry 106 that receives the differential input signal 110 and generates the output signal 112. In the input stage 102, the folded cascode circuitry 106 includes dual current mirror circuitry 108. The dual current mirror circuitry 108 includes two current mirrors coupled in parallel to source current to the cascode transistors of the folded cascode circuitry 106. While a first current mirror of the dual current mirror circuitry 108 includes degeneration, the second current mirror does not include degeneration. The second current mirror is normally off, but operates as an active clamp during slewing of the folded cascode circuitry 106. The clamping voltage is controllable. The second current mirror also reduces distortion in the folded cascode circuitry 106 by moving a pole of the folded cascode circuitry 106 to a higher frequency.

Figure 2:
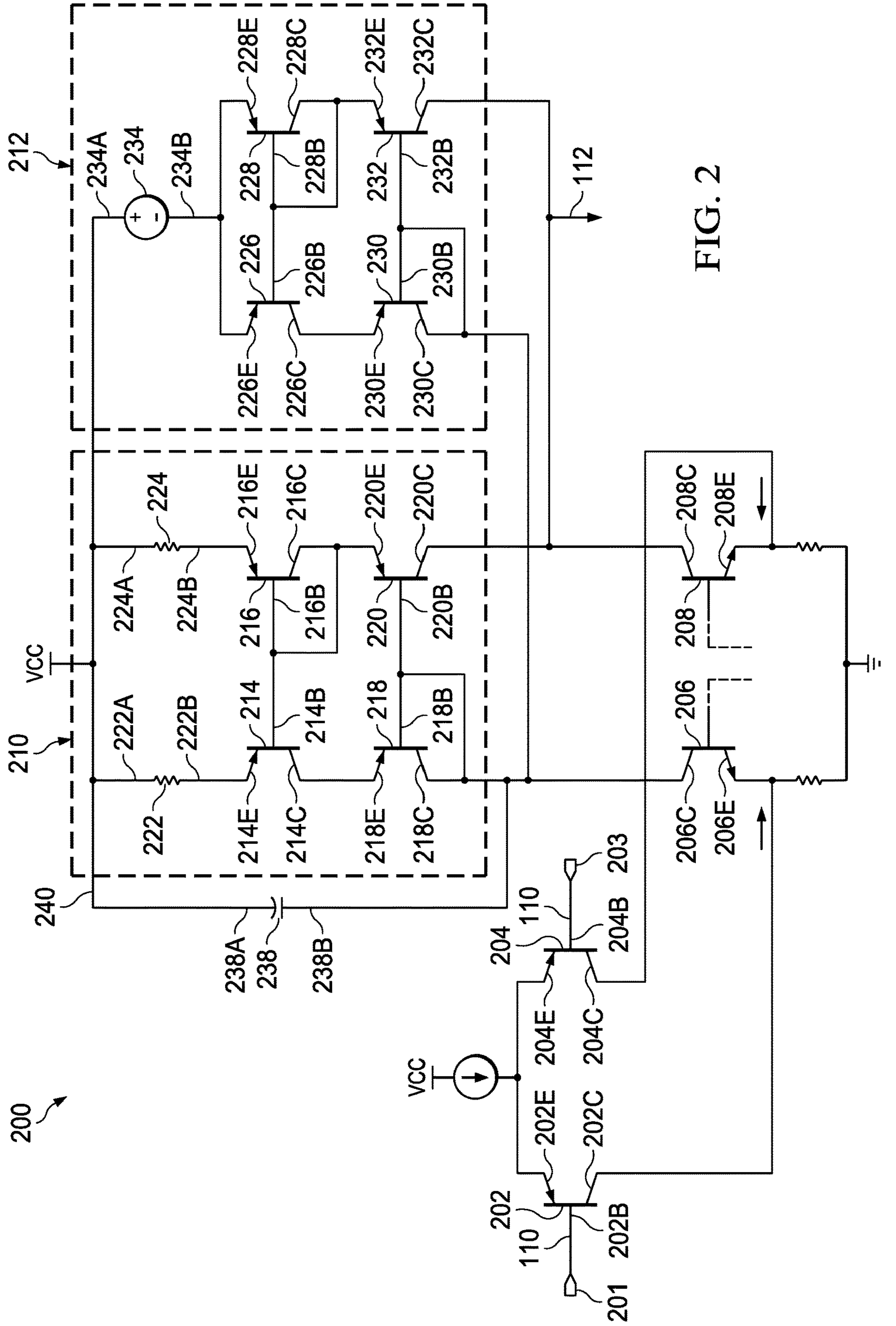
FIG. 2 shows a schematic diagram for an example amplifier input stage that includes dual current mirror circuits in accordance with the present disclosure.

FIG. 2 shows a schematic diagram for an example input stage 200 of an amplifier in accordance with the present disclosure. The input stage 200 is an implementation of the input stage 102. The input stage 200 includes an input transistor 202, an input transistor 204, a cascode transistor 206, a cascode transistor 208, a current mirror circuit 210, and a current mirror circuit 212. The input transistor 202 and the input transistor 204 are arranged to receive the differential input signal 110. The input transistor 202 includes a base terminal 202B that is coupled to an input terminal 201. The input transistor 204 includes a base terminal 204B that is coupled to an input terminal 203. An emitter terminal 202E of the input transistor 202 is coupled to an emitter terminal 204E of the input transistor 204. The input transistor 202 and the input transistor 204 are bipolar PNP transistors in some implementations of the input stage 200.

The collector terminal 202C of the input transistor 202 is coupled to the emitter terminal 206E of the cascode transistor 206, and the collector terminal 204C of the input transistor 204 is coupled to the emitter terminal 208E of the cascode transistor 208. The collector terminal 206C of the cascode transistor 206 and the collector terminal 208C of the cascode transistor 208 are coupled to the current mirror circuit 210 and the current mirror circuit 212. As shown in FIG. 2, the cascode transistor 206 and the cascode transistor 208 are bipolar NPN transistors in some implementations of the input stage 200.

The current mirror circuit 210 and the current mirror circuit 212 are disposed in parallel to source current to the cascode transistor 206 and the cascode transistor 208. The current mirror circuit 210 includes transistor 214, transistor 216, transistor 218, and transistor 220. The transistor 214, the transistor 216, the transistor 218, and the transistor 220 are bipolar PNP transistors in some implementations of the input stage 200. The transistor 218 is diode-connected with the base terminal 218B coupled to the collector terminal 218C. The collector terminal 218C of the transistor 218 is coupled to the collector terminal 206C of the cascode transistor 206. The base terminal 218B of the transistor 218 is also coupled to the base terminal 220B of the transistor 220. The collector terminal 220C of the transistor 220 is coupled to the collector terminal 208C of the cascode transistor 208.

The transistor 216 is diode-connected with the base terminal 216B coupled to the collector terminal 216C. The collector terminal 216C is coupled to the emitter terminal 220E of the transistor 220. The base terminal 216B of the transistor 216 is also coupled to the base terminal 214B of the transistor 214. The collector terminal 214C of the transistor 214 is coupled to the emitter terminal 218E of the transistor 218.

The current mirror circuit 210 is coupled to the power supply rail 240 by the resistor 222 and the resistor 224. The resistor 222 and the resistor 224 are degeneration resistors. The resistor 222 includes a terminal 222A coupled to the power supply rail 240, and a terminal 222B coupled to the emitter terminal 214E of the transistor 214. The resistor 224 includes a terminal 224A coupled to the power supply rail 240, and a terminal 224B coupled to the emitter terminal 216E of the transistor 216.

In some implementations of the input stage 200, a capacitor 238 is coupled to the current mirror circuit 210 and the current mirror circuit 212 (e.g., the transistor 218 and the transistor 230), and the power supply rail 240. The capacitor 238 includes a terminal 238A coupled to the power supply rail 240, and a terminal 238B coupled to the collector terminal 206C of the cascode transistor 206.

The current mirror circuit 212 includes transistor 226, transistor 228, transistor 230, and transistor 232. The transistor 226, the transistor 228, the transistor 230, and the transistor 232 are bipolar PNP transistors in some implementations of the input stage 200. The transistor 230 is diode-connected with the base terminal 230B coupled to the collector terminal 230C. The collector terminal 230C of the transistor 230 is coupled to the collector terminal 206C of the cascode transistor 206. The base terminal 230B of the transistor 230 is also coupled to the base terminal 232B of the transistor 232. The collector terminal 232C of the transistor 232 is coupled to the collector terminal 208C of the cascode transistor 208.

The transistor 228 is diode-connected with the base terminal 228B coupled to the collector terminal 228C. The collector terminal 228C of the transistor 228 is coupled to the emitter terminal 232E of the transistor 232. The base terminal 228B of the transistor 228 is also coupled to the base terminal 226B of the transistor 226. The collector terminal 226C of the transistor 226 is coupled to the emitter terminal 230E of the transistor 230.

The super source follower circuit 234 couples the transistor 226 and the transistor 228 to the power supply rail 240. The super source follower circuit 234 includes a terminal 234A coupled to the power supply rail 240, and a terminal 234B coupled to the emitter terminal 226E of the transistor 226 and the emitter terminal 228E of the transistor 228. The super source follower circuit 234 is voltage source that sets a threshold for operation of the current mirror circuit 212. The current mirror circuit 212 is turned off when the voltage across the current mirror circuit 212 is less than the voltage generated by the super source follower circuit 234, and turned on when the voltage across the current mirror circuit 212 is greater than the voltage generated by the super source follower circuit 234. Accordingly, during quiescent or small signal operation, the current mirror circuit 212 is turned off. During slewing, and for large signals, the current in the resistors 222 and 224 of the current mirror circuit 210 increases, and the voltage across the current mirror circuit 212 increases, which turns on the current mirror circuit 212. The current mirror circuit 212 reduces the overall voltage dropped across the current mirror circuit 210 and the current mirror circuit 212 to increase the headroom of the input stage 200. Additionally, the current mirror circuit 212, when turned on, reduces the impedance presented by the current mirror circuit 210 and the current mirror circuit 212, which shifts the pole/zero pair provided at the current mirrors to a higher frequency and reduces harmonic distortion in the input stage 200.

Some implementations of the input stage 200 include field effect transistors (FETs) rather than bipolar transistors. For example, bipolar PNP transistors are replaced by PFETs and bipolar NPN transistors are replaced by NFETs in some implementations of the input stage 200.

Figure 3:
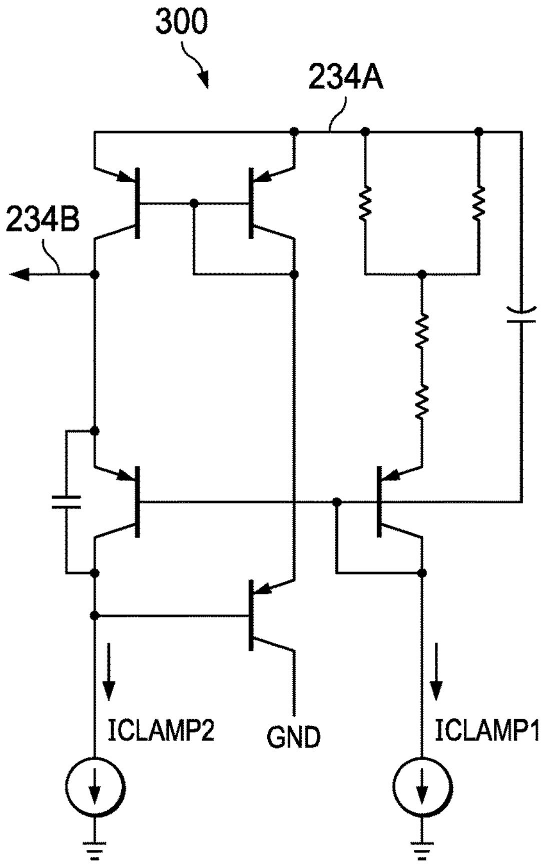
FIGS. 3 and 4 show schematics for example super source follower circuits suitable for use with dual current mirror circuits in accordance with the present disclosure.

FIG. 3 shows a schematic for a first example super source follower circuit 300 suitable for use with the current mirror circuit 212. The super source follower circuit 300 is an implementation of the super source follower circuit 234.

Figure 4:
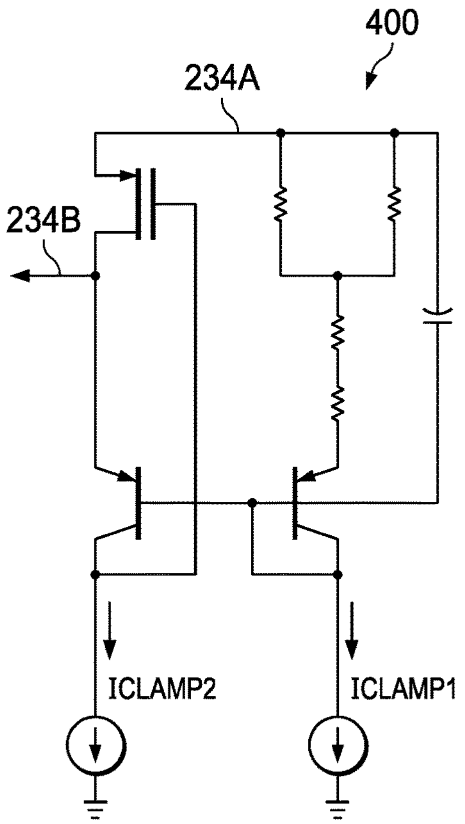

FIG. 4 shows a schematic for a first example super source follower circuit 400 suitable for use with the current mirror circuit 212. The super source follower circuit 400 is an implementation of the super source follower circuit 234.

The super source follower circuit 300 and the super source follower circuit 400 illustrate examples of voltage source circuits that are suitable for use in implementations of the input stage 200. Other implementations of a low impedance voltage source are also suitable for use in the input stage 200.

Figure 5:
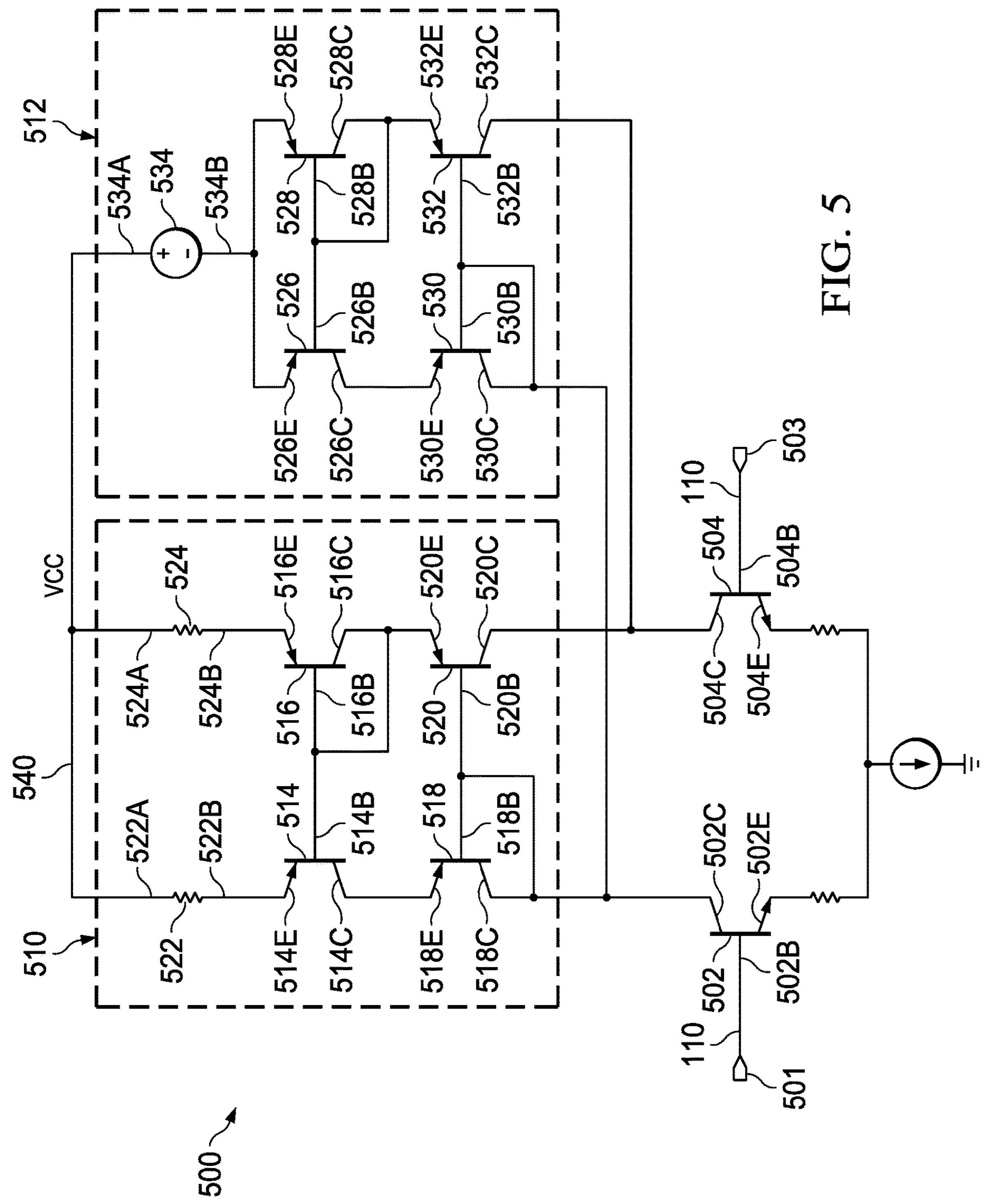
FIG. 5 shows a schematic diagram for an example telescopic input stage that includes dual current mirror circuits in accordance with the present disclosure.

FIG. 5 shows a schematic diagram for an example telescopic input stage 500 that includes dual current mirror circuits in accordance with the present disclosure. The input stage 500 is suitable for use in place of the input stage 102 in some implementations of the amplifier 100. The input stage 500 includes an input transistor 502, an input transistor 504, a current mirror circuit 510, and a current mirror circuit 512. The input transistor 502 and the input transistor 504 are arranged to receive the differential input signal 110. The input transistor 502 includes a base terminal 502B that is coupled to an input terminal 501. The input transistor 504 includes a base terminal 504B that is coupled to an input terminal 503. An emitter terminal 502E of the input transistor 502 is coupled to an emitter terminal 504E of the input transistor 504. The input transistor 502 and the input transistor 504 are bipolar NPN transistors in some implementations of the input stage 500.

The collector terminal 502C of the input transistor 502, and the collector terminal 504C of the input transistor 504, are coupled to current mirror circuit 510 and the current mirror circuit 512. The current mirror circuit 510 and the current mirror circuit 512 are disposed in parallel to source current to the input transistor 502 and the input transistor 504. The current mirror circuit 510 includes transistor 514, transistor 516, transistor 518, and transistor 520. The transistor 514, the transistor 516, the transistor 518, and the transistor 520 are bipolar PNP transistors in some implementations of the input stage 500. The transistor 518 is diode-connected with the base terminal 518B coupled to the collector terminal 518C. The collector terminal 518C of the transistor 518 is coupled to the collector terminal 502C of the input transistor 502. The base terminal 518B of the transistor 518 is also coupled to the base terminal 520B of the transistor 520. The collector terminal 520C of the transistor 520 is coupled to the collector terminal 504C of the input transistor 504.

The transistor 516 is diode-connected with the base terminal 516B coupled to the collector terminal 516C. The collector terminal 516C is coupled to the emitter terminal 520E of the transistor 520. The base terminal 516B of the transistor 516 is also coupled to the base terminal 514B of the transistor 514. The collector terminal 514C of the transistor 514 is coupled to the emitter terminal 518E of the transistor 518.

The current mirror circuit 510 is coupled to the power supply rail 540 by the resistor 522 and the resistor 524. The resistor 522 and the resistor 524 are degeneration resistors. The resistor 522 includes a terminal 522A coupled to the power supply rail 540, and a terminal 522B coupled to the emitter terminal 514E of the transistor 514. The resistor 524 includes a terminal 524A coupled to the power supply rail 540, and a terminal 524B coupled to the emitter terminal 516E of the transistor 516.

The current mirror circuit 512 includes transistor 526, transistor 528, transistor 530, and transistor 532. The transistor 526, the transistor 528, the transistor 530, and the transistor 532 are bipolar PNP transistors in some implementations of the input stage 500. The transistor 530 is diode-connected with the base terminal 530B coupled to the collector terminal 530C. The collector terminal 530C of the transistor 530 is coupled to the collector terminal 502C of the input transistor 502. The base terminal 530B of the transistor 530 is also coupled to the base terminal 532B of the transistor 532. The collector terminal 532C of the transistor 532 is coupled to the collector terminal 504C of the input transistor 504.

The transistor 528 is diode-connected with the base terminal 528B coupled to the collector terminal 528C. The collector terminal 528C of the transistor 528 is coupled to the emitter terminal 532E of the transistor 532. The base terminal 528B of the transistor 528 is also coupled to the base terminal 526B of the transistor 526. The collector terminal 526C of the transistor 526 is coupled to the emitter terminal 530E of the transistor 530.

The super source follower circuit 534 couples the transistor 526 and the transistor 528 to the power supply rail 540. The super source follower circuit 534 includes a terminal 534A coupled to the power supply rail 540, and a terminal 534B coupled to the emitter terminal 526E of the transistor 526 and the emitter terminal 528E of the transistor 528. The super source follower circuit 534 is voltage source that sets a threshold for operation of the current mirror circuit 512. The current mirror circuit 512 is turned off when the voltage across the current mirror circuit 512 is less than the voltage generated by the super source follower circuit 534, and turn on when the voltage across the current mirror circuit 512 is greater than the voltage generated by the super source follower circuit 534. Accordingly, during quiescent or small signal operation, the current mirror circuit 512 is turned off. During slewing, and for large signals, the current in the resistors 522 and 524 of the current mirror circuit 510 increases, and the voltage across the current mirror circuit 512 increases, which turns on the current mirror circuit 512. The current mirror circuit 512 reduces the overall voltage dropped across the current mirror circuit 510 and the current mirror circuit 512 to increase the headroom of the input stage 500. Additionally, the current mirror circuit 512, when turned on, reduces the impedance presented by the current mirror circuit 510 and current mirror circuit 512, which shifts the pole/zero pair provided at the current mirrors to a higher frequency and reduce harmonic distortion in the input stage 500.

Some implementations of the input stage 200 or the input stage 500 include simple current mirror circuits rather than the more complex current mirror circuits 210, 212, 510, and 512 shown in FIGS. 2 and 5. For example, in an implementation of the input stage 200, the current mirror circuit 210 omits the transistor 214 and the transistor 216, and couples the emitter terminal 218E of the transistor 218 to the terminal 222B of the resistor 222, and the emitter terminal 220E of the transistor 220 to the terminal 224B of the resistor 224. Similarly, in an implementation of the current mirror circuit 210, the transistor 226 and the transistor 228 are omitted, and the emitter terminal 230E of the transistor 230 and the emitter terminal 232E of the transistor 232 are coupled to the terminal 234B of the super source follower circuit 234.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:

a first input transistor coupled to a first input terminal;

a second input transistor coupled to a second input terminal;

a first current mirror circuit coupled to the first input transistor and the second input transistor; and a second current mirror circuit coupled to the first input transistor, the second input transistor, and the first current mirror circuit;

wherein the second current mirror circuit comprises:

a first transistor coupled to the second input transistor and the first transistor of the first current mirror circuit, and coupled to a power supply rail via a super source follower circuit; and a second transistor, connected as a diode, and coupled to the first input transistor, the first transistor of the second current mirror circuit, and the second transistor of the first current mirror circuit, and coupled to the power supply rail via the super source follower circuit.

2. The amplifier of claim 1, wherein the second current mirror circuit comprises:

a third transistor, connected as a diode, and coupled to the first transistor of the second current mirror circuit and the super source follower circuit; and a fourth transistor coupled to the second transistor of the second current mirror circuit, and the super source follower circuit.

3. The amplifier of claim 1, further comprising a capacitor coupled to the second transistor of the first current mirror circuit, the second transistor of the second current mirror circuit and the power supply rail.

4. An amplifier input stage, comprising:

a first input transistor, comprising a first terminal coupled to a first signal input terminal;

a second input transistor, comprising:

a first terminal coupled to a second signal input terminal; and a second terminal coupled to a second terminal of the first input transistor;

a first cascode transistor comprising a first terminal coupled to a third terminal of the first input transistor;

a second cascode transistor comprising a first terminal coupled to a third terminal of the second input transistor;

a first current mirror circuit coupled to a second terminal of the first cascode transistor and a second terminal of the second cascode transistor; and a second current mirror circuit coupled to the second terminal of the first cascode transistor and the second terminal of the second cascode transistor;

wherein the second current mirror circuit comprises:

a first transistor comprising:

a first terminal coupled to the second terminal of the first cascode transistor; and a second terminal coupled to the first terminal of the first transistor of the second current mirror circuit; and a second transistor comprising:

a first terminal coupled to the second terminal of the second cascode transistor; and a second terminal coupled to the second terminal of the first transistor of the second current mirror circuit;

wherein the second current mirror circuit comprises:

a third transistor comprising a first terminal coupled to a third terminal of the first transistor of the second current mirror circuit; and a fourth transistor comprising:

a first terminal coupled to a third terminal of the second transistor of the second current mirror circuit; and a second terminal coupled to the first terminal of the fourth transistor of the second current mirror circuit.

5. An amplifier input stage, comprising:

a first input transistor, comprising a first terminal coupled to a first signal input terminal;

a second input transistor, comprising:

a first terminal coupled to a second signal input terminal; and a second terminal coupled to a second terminal of the first input transistor;

a first cascode transistor comprising a first terminal coupled to a third terminal of the first input transistor;

a second cascode transistor comprising a first terminal coupled to a third terminal of the second input transistor;

a first current mirror circuit coupled to a second terminal of the first cascode transistor and a second terminal of the second cascode transistor; and a second current mirror circuit coupled to the second terminal of the first cascode transistor and the second terminal of the second cascode transistor;

wherein the first current mirror circuit comprises:

a first transistor comprising:

a first terminal coupled to the second terminal of the first cascode transistor; and a second terminal coupled to the first terminal of the first transistor of the first current mirror circuit; and a second transistor comprising:

a first terminal coupled to the second terminal of the second cascode transistor; and a second terminal coupled to the second terminal of the first transistor of the first current mirror circuit;

wherein the first current mirror circuit comprises:

a third transistor comprising a first terminal coupled to a third terminal of the first transistor of the first current mirror circuit; and a fourth transistor comprising:

a first terminal coupled to a third terminal of the second transistor of the first current mirror circuit; and a second terminal coupled to the first terminal of the fourth transistor of the first current mirror circuit.

6. The amplifier input stage of claim 5, further comprising:

a first resistor comprising:

a first terminal coupled to a third terminal of the third transistor of the first current mirror circuit; and a second terminal coupled to a power supply rail; and a second resistor comprising:

a first terminal coupled to a third terminal of the fourth transistor of the first current mirror circuit; and a second terminal coupled to the power supply rail.

7. An amplifier, comprising:

a first input transistor and a second input transistor configured to receive a differential input signal;

a first cascode transistor coupled to the first input transistor;

a second cascode transistor coupled to the second input transistor;

a first current mirror circuit configured to source current to the first cascode transistor and the second cascode transistor; and a second current mirror circuit coupled to the first cascode transistor and the second cascode transistor in parallel with the first current mirror circuit, and configured to source current to the first cascode transistor and the second cascode transistor.

8. The amplifier of claim 7, further comprising a first resistor and a second resistor that couple the first current mirror circuit to a power supply rail.

9. The amplifier of claim 8, further comprising a super source follower circuit that couples the second current mirror circuit to the power supply rail.

10. The amplifier of claim 7, wherein the first current mirror circuit comprises:

a first transistor;

a second transistor, connected as a diode, and coupled to the first transistor of the first current mirror circuit;

a third transistor, connected as a diode, and coupled to the first transistor of the first current mirror circuit and the first cascode transistor; and a fourth transistor coupled to the second transistor of the first current mirror circuit, the third transistor, and the second cascode transistor.

11. The amplifier of claim 7, wherein the second current mirror circuit comprises:

a first transistor;

a second transistor, connected as a diode, and coupled to the first transistor of the second current mirror circuit;

a third transistor, connected as a diode, and coupled to the first transistor of the second current mirror circuit and the first cascode transistor; and a fourth transistor coupled to the second transistor of the second current mirror circuit, the third transistor of the second current mirror circuit, and the second cascode transistor.

* * * * *